United States Patent [19]

Ohta et al.

[11] Patent Number: 4,654,888
[45] Date of Patent: Mar. 31, 1987

[54] IMAGE SUPPRESSION MIXER OF THE WAVEGUIDE TYPE

[75] Inventors: Tomozo Ohta, Ikoma; Hiroshi Nakano, Tenri, both of Japan

[73] Assignee: Sharp Kabushiki Kaisha, Osaka, Japan

[21] Appl. No.: 735,753

[22] Filed: May 20, 1985

[30] Foreign Application Priority Data

May 18, 1984 [JP] Japan ................ 59-101522

[51] Int. Cl.⁴ ............... H04B 1/26; H04B 1/10
[52] U.S. Cl. .................. 455/328; 455/302; 455/317; 455/330
[58] Field of Search .......... 455/302, 317, 325–328, 455/330

[56] References Cited

U.S. PATENT DOCUMENTS 4,412,354 10/1983 Hu ........................ 455/328
4,563,773 1/1986 Dixon, Jr. et al. ........... 455/330

FOREIGN PATENT DOCUMENTS 78602 6/1980 Japan ................ 455/328

OTHER PUBLICATIONS

"A Subharmonically Pumped Fin–Line Mixer for Satellite TV Receiver Applications", by Gunther Begemann, 1981.

Primary Examiner—Jin F. Ng
Attorney, Agent, or Firm—Birch, Stewart, Kolasch and Birch

[57] ABSTRACT

An image suppression mixer of the waveguide type is disclosed which includes a waveguide signal input terminal at one end of a waveguide, a local oscillation input terminal at the other end of the waveguide, a mixer diode inserted within the waveguide and an IF signal output terminal connected to the mixer diode. At least the width of the waveguide on the side of the waveguide signal input terminal is selected to be a cut-off dimension for the image frequencies $f_m$ and the local oscillation frequency $f_1$ the waveguide signal frequencies $f_2$, the local oscillation frequency $f_1$ and the image frequencies $f_m$ are correlated as $f_m < f_1 < f_s$.

10 Claims, 8 Drawing Figures

IMAGE SUPPRESSION MIXER OF THE WAVEGUIDE TYPE

BACKGROUND OF THE INVENTION

This invention relates to an image suppression mixer of the waveguide type which not only has the effect of image suppression but also prevents leakage of local oscillation signals to signal circuits through a simple circuit structure.

Recently, satellite broadcast systems have been introduced in various countries, with the development of various kinds of satellite broadcast receivers. The important features of such satellite broadcast receivers are low noise, efficient image suppression, low leakage of local oscillation and so forth. The low feature determines the receiving sensitivity of the receiver, while the image suppression effect and low leakage of local oscillation affect interference between ground communication lines and satellite communication systems. External objectionable signals and noise of image frequencies of the receiver applied to the receiver impair the signal to noise ratio during reception and demodulation, and local oscillation signals leaked into the receiver serve as interference with other communication systems.

Though various attempts have been made to improve the characteristics of the receiver, such improvement should be particularly simple and inexpensive, especially in the case where the receiver is used for a specific purpose.

One of the components which predominantly determine the major characteristics of the receiver is a receiver mixer. As is well known in the art, the function of the mixer is to mix satellite broadcast and local oscillation into an intermediate frequency (IF). A receiver mixer which is very simple in structure but excellent in performance will be of importance for practical use.

There are two types of conventional receiver mixers, an MIC mixer having strip lines, and a waveguide type mixer.

The waveguide type mixer is generally bigger in shape than the MIC type but much better in performance, having lower circuit loss thanks to a higher Q value. This advantage is more significant at higher frequencies.

The following is directed to a conventional waveguide type as shown in FIG. 4, because the present invention is interested in an improvement in the waveguide type mixer. In FIG. 4, the mixer includes a signal input terminal 1, a local oscillation input terminal 2, a band pass filter 3 for passage of signal frequencies, a band pass filter 4 for passage of local frequency, an IF signal output terminal 5 and a mixer diode 6.

Signals are fed through the terminal 1 and then applied to the diode 6 through the filter 3. Local oscillation is fed through the terminal 2 and applied to the diode 6 by way of the filter 4. Consequently, IF signals are delivered through the output terminal 5.

The property of the filter 3 blocks signals of image frequencies coming through the terminal 1 and suppress image components. Further, the property of the filter 3 prevents local oscillation components from leaking into the signal terminal 1. Image components generating at the mixer diode 6 on the other hand are blocked through the filters 3 and 4 and usually returned to the diode 6 (image recovery operation).

The feature of this structure is low conversion loss at the mixer because of its implementation, with relatively low circuit loss. However, it is large and complicated in structure and not suited for mass production.

A mixer of solid plan circuit is well known as another sort of the waveguide type mixer which has low conversion loss and is low noise and suitable for mass production.

FIGS. 5(a) and 5(b) illustrate the above metioned sort of the receiver mixer wherein a metal plate is inserted in the direction of signal propagation at the center of a wider side of a linear waveguide and provided with a local frequency band pass filter, a trap filter and so forth thereon. FIG. 5(a) is a side view thereof and FIG. 5(b) is a top view.

The mixer shown therein comprises a trap (block) filter 7 for local oscillation frequency or image frequency and a dielectric trap (block) filter 8 for an improved characteristic in preventing local oscillation from leaking into the signal terminal 1, as well as including the signal input terminal 1, the local oscillation input terminal 2, the local oscillation frequency band pass filter 4, the IF signal output terminal 5 and the mixer diode 6.

As in the type of mixer of FIG. 4, signals are fed through the terminal 1 and local oscillation is fed through the terminal 2, and IF signals generating at the mixer diode 6 are delivered through the terminal 5.

Image frequency components fed through the signal terminal 1 are blocked with the image trap filter 7 and substantially prevented from reaching the diode 6 due to short-circuit load at image frequencies generating at the location of the diode 6, which load is caused by the property of the local oscillation band pass filter 4. As mentioned previously, this sort of mixer has excellent properties such as low conversion loss and low noise and appropriateness for mass production. However, if more effective image suppression and lesser leakage of local oscillation into the signal terminal are desirable, precise and complicated design and adjustment are required for the dielectric local oscillation trap filter 8 itself, the characteristics of the image trap filter 7 and the local oscillation filter 4 and electric arrangement of the diode 6 in relation with those filters. This renders design and manufacture of the mixer difficult.

In some cases, a multi-stage trap filter is required with the results in a higher degree of complexity and deteriorated performance characteristics.

OBJECT OF THE INVENTION

Accordingly, the object of the present invention is to provide an effective solution to the above problems with the conventional waveguide type mixers and, more particularly to ensure more effective image suppression and prevention of local oscillation leakage through use of a simple tool.

In particular, the mixer circuit structure is made simpler and the problems as discussed above are solved by applying the present invention to the solid plan mixer of FIG. 5, while enjoying the outstanding features of the solid plan mixer including mass productivity.

DETAILED DESCRIPTION OF THE PREFERRED EMBODIMENTS

The present invention relies in part on the fact that the internal lateral widths of a waveguide, a base for a solid plan mixer, is dimensioned partially or as a whole into a cutoff size for image frequencies and local oscillation frequency whereby a solid plan mixer circuit is set up in the waveguide to avoid the necessity of trap filters of the image frequencies and local oscillation frequency as required in the conventional mixer. With such an arrangement, the circuit is made simpler and the effects of image suppression and local oscillation leakage are enhanced.

The lateral widths of the waveguide at the signal input terminal and the local oscillation input terminals are not necessarily identical and selected properly in conjunction with the image frequencies, local oscillation frequency and signal frequency.

Figure 3:
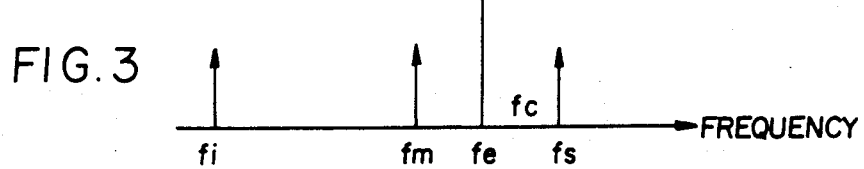
FIG. 3 is a frequency diagram showing frequency allotment of the mixer.
Figure 4:
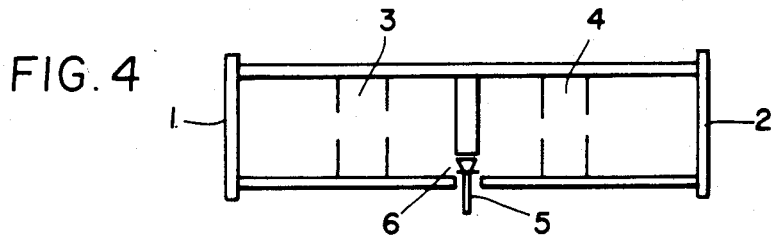
FIG. 4 is a cross sectional side view of a conventional waveguide type mixer.

To take frequency components into consideration and maintain the wide band property of waveguide characteristic impedance against those components, the signal input terminal and the local oscillation input terminal are connected by way of a tapered waveguide or a λ/4 transformer (λ: wavelength).

Where $f_l$ is the local oscillation frequency and $f_s$ is the signal frequency, the image frequency $f_m$ is represented as $f_m = 2f_l - f_s$ (when $f_s > f_l$) or $f_m = 2f_s - f_l$ (when $f_l > f_s$). As is understood from the following description of embodiments of the present invention, the invention is applicable only when $f_s > f_l$. FIG. 3 depicts such frequency relationship wherein $f_i$ is the output frequency.

Figure 1A:
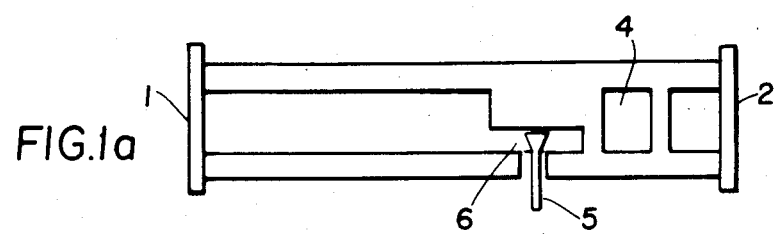
FIGS. 1(a) and 1(b) are a cross sectional side view and a cross sectional plan view of a mixer according to an embodiment of the present invention respectively.
Figure 1B:
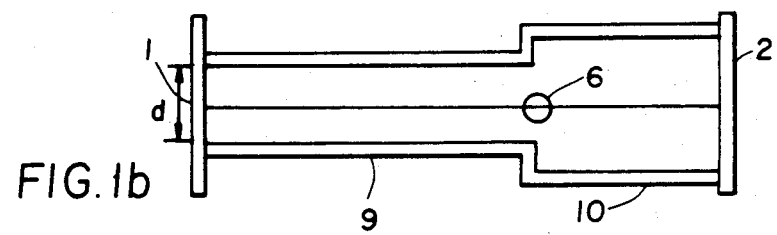
Figure 5A:
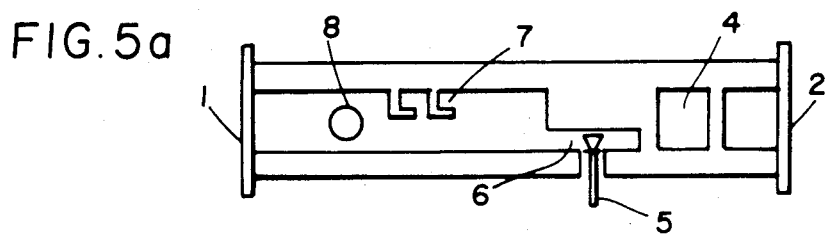
FIGS. 5(a) and 5(b) are a cross sectional view and a cross sectional plan view of a conventional solid plan mixer which is closely related to the present invention.
Figure 5B:
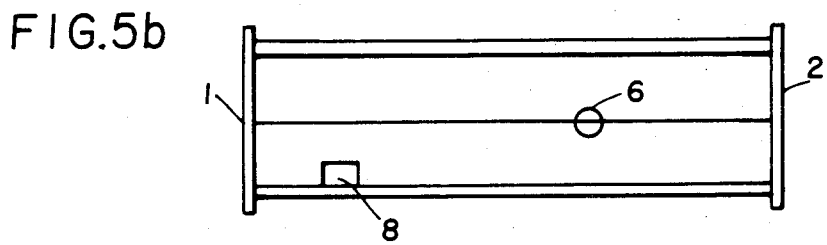

Referring now to FIGS. 1(a) and 1(b), there are illustrated a side view of a waveguide of a mixer according to an embodiment of the present invention and a plan view from a wider side of the waveguide. The mixer according to the present invention, likewise the conventional solid plan mixer as shown in FIG. 5, includes a signal input terminal 1, a local oscillation input terminal 2, a local oscillation band pass filter 4, an IF output terminal 5, and a mixer diode 6. It is divided into a signal input waveguide section 9 and a local oscillation input waveguide section 10.

According to the present invention, the lateral dimension d of the signal input waveguide section 9 is selected narrower than that of the local oscillation input waveguide section 10 in such a way that it exhibits a cutoff state for the local oscillation frequency and image frequencies. The mixer diode 6 is positioned within the waveguide so dimensioned, especially in the neighborhood of the boundary between the signal input waveguide section 9 and the local oscillation waveguide section 10.

The above arrangement eliminates the necessity for the trap filter 7 of the local oscillation frequency $f_l$ or the image frequencies $f_m$ or the dielectric trap filter 8 for local oscillation as required in the conventional mixer of FIG. 5.

It is well known that, if the lateral width d in the waveguide is selected to be $d < \lambda c/2$ in relation with the wavelength $\lambda_c$ of signals, the signals assume cutoff state in the waveguide, making propagation impossible in the waveguide. The signals are inclined to reflect within the waveguide, which reflection increases greatly depending upon the length of cutoff waveguide in the direction of propagation.

As a result, the cutoff frequency $f_c$ of the signal input waveguide section 9 is selected to be $f_l < f_c < f_s$ in the frequency allotment as shown in FIG. 3. The local oscillation input waveguide section 10 is dimensioned in a manner similar to that in the conventional mixer.

With such an arrangement, the cutoff waveguide section 9 blocks and prevents image frequency components coming through the signal input terminal 1 from reaching the mixer diode 6, thus ensuring effective image suppression. At the same time, the cutoff waveguide section inhibits local oscillation applied through the local oscillation terminal 2 from leaking into the signal terminal 1.

Image components generating at the mixer diode 6 reflect with the waveguide and returns to the diode 6 without adverse effect on operation of the mixer.

As noted earlier, the present invention eliminates the necessity for the image and local oscillation blocking filters as required in the conventional mixer, simplifies circuit arrangement, reduces signal loss that might occur due to the presence of those filters to a minimum, and ensures much more effective image suppression and prevention of local oscillation leakage, thanks to a special design of the signal input waveguide.

However, the above embodiment has the disadvantage that the line impedance of the waveguide is not continuous because of an abrupt change of the lateral width of the waveguide between the signal input waveguide section and the local oscillation input waveguide section. This is undesirable especially when wide band characteristic is necessary. Thus, a solution to this problem is more preferable in practical use of the present invention.

Figure 2A:
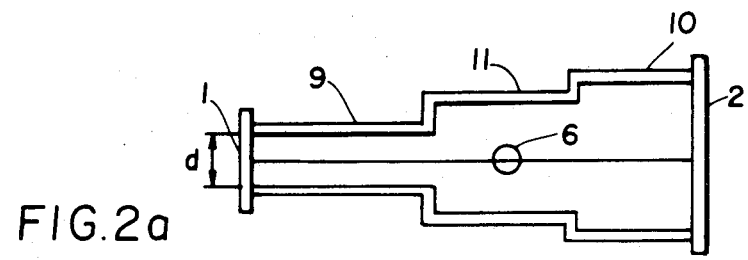
FIGS. 2(a) and 2(b) are cross sectional plan views of other embodiments of the present invention.
Figure 2B:
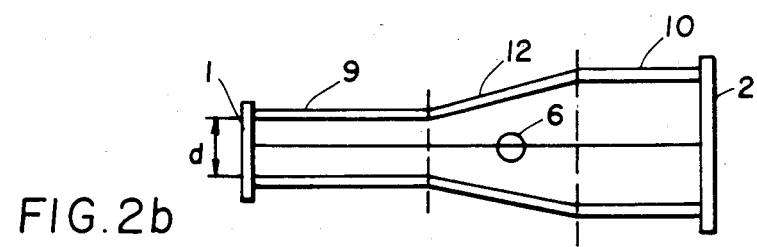

FIGS. 2(a) and 2(b) show an improvement over the foregoing embodiment, wherein there is provided a smooth change in the line impedance of the waveguide by slanting the connection between the signal input waveguide section 9 and the local oscillation input waveguide section 10. FIG. 2(a) shows the case where a λ/4 transformer 11 (λ: wavelength) used for the signal frequencies $f_s$ and FIG. 2(b) the case where a tapered waveguide 12 is used. The two figures each show a plan view of the wider side of the waveguide, its side view is the same as in FIG. 1(a).

The mixer diode 6 is inserted in the neighborhood of a waveguide conversion section as designated 11 or 12. The effects of image suppression and prevention of local oscillation leak are determined by the length of the cutoff waveguide section at the signal input side as in the embodiment of FIG. 1.

Furthermore, another specific limit may be placed on the lateral widths of the signal input waveguide section 5 and the local oscillation input waveguide section 10 in conjunction with the relationship among the signal, local oscillation and image frequencies, with the same configuration as shown in FIGS. 1 and 2. While the lateral width of the signal input waveguide section 9 is selected such that its cutoff frequency $f_c$ is $f_l < f_c < f_s$ as seen in FIGS. 1 and 2, the lateral width of the local oscillation input waveguide section 10 is selected such that its cutoff frequency $f_c'$ is $f_m < f_c' < f_l$. That is, the signal input waveguide section 9 and the local oscillation input waveguide section 10 both stand in cutoff state for the image frequencies $f_m$ and inhibit application of external image signal components.

In this instance, all that the local oscillation filter 4 must do is allow passage of the local oscillation frequency $f_l$ and block the signal frequencies $f_s$. No particular attention is paid to characteristics at the image frequencies $f_m$, assuring an easy-to-design filter.

The image frequency components generating at the mixer diode 6, on the other hand, are prevented from traveling to the signal input terminal 1 and the local oscillation input terminal 2. Image recovery is made easy because of a closed circuit set up around the diode.

The specific limits on the lateral widths of the waveguide as described above are very effective in assuring the effects of image suppression and prevention of local oscillation leakage, thereby facilitating the design of the local oscillation band pass filter and maintaining effective image recovery in the mixer with readiness.

Within the waveguide where both the signal input waveguide section 9 and the local oscillation input waveguide section 10 assume cutoff state for the local oscillation and image frequencies, there may be provided the mixer diode and the local oscillation filter. For example, though the same dimensions are not necessary, the lateral width of the whole waveguide in the solid plan mixer of FIG. 5 is selected to be a cutoff dimension for the local oscillation and image frequencies. In this instance, it is more preferable that the trap filters 7 and 8 be eliminated and the mixer diode 6 and the local oscillation filter 4 be positioned so closely to the local oscillation input terminal 2 that local oscillation from the terminal 2 may be applied to the mixer diode 6.

As stated, pursuant to the present invention, within the mixer where the signal, local oscillation and image frequencies $f_c$, $f_l$ and $f_m$ are correlated as $f_m < f_l < f_s$, the signal input waveguide section, with the cutoff dimension for the local oscillation and image frequencies, and the local oscillation input waveguide section, with the lateral width equal to or greater than that of the signal input waveguide section, are connected directly or by way of the $\lambda/4$ transformer or the tapered waveguide. More particularly, by provision of a special peripheral circuit in the conventional solid plan circuit of the mixer, the demand for the various trap filters for the local oscillation and image frequencies as required in the conventional mixer is eliminated and the effects of image suppression and prevention of local oscillation leak are remarkably improved while keeping the advantage of the mixer having the solid plan circuit in low conversion loss. Accordingly, the present invention offers a simple but excellent mixer useful for satelite broadcast systems.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An image suppression mixer of the waveguide type comprising:
    a waveguide signal input terminal at a first end of a waveguide;
    a local oscillation input terminal at a second end of said waveguide;
    a mixer diode inserted within said waveguide; and
    an IF signal output terminal connected to said mixer diode;
    wherein a width of said waveguide on the first end of said waveguide, including said waveguide signal input terminal, is selected to be of such a dimension that image and local oscillation frequencies are cut off, a width of said waveguide at the second end of said waveguide, including said local oscillation input terminal, being larger than said width on said first end, said mixer diode being disposed at a transition region in said waveguide in which the waveguide width varies to accommodate a junction of the first end of the waveguide and the second end of the waveguide.

2. An image suppression mixer of the waveguide type according to claim 1 wherein said transition region is a $\lambda/4$ waveguide transformer where $\lambda$ is a wavelength.

3. An image suppression mixer of the waveguide type according to claim 1 further comprising a metal plate inserted at the center of the end of the local oscillation input terminal in the direction of signal propagation.

4. The image suppression mixer of the waveguide type according to claim 1 wherein said transition region is a tapered waveguide.

5. An image suppression mixer of the waveguide type comprising:
    a waveguide signal input terminal at one end of a waveguide;
    a local oscillation input terminal at the other end of said waveguide;
    a mixer diode inserted within said waveguide; and
    an IF signal output terminal connected to said mixer diode;
    wherein a waveguide signal frequency $f_s$, a local oscillation frequency $f_l$ and an image frequency $f_m$ are correlated as $f_m < f_l < f_s$,
    wherein at least the width of said waveguide on the one end of said waveguide signal input terminal is selected to be of such a dimension that the image frequency $f_m$ and the local oscillation frequency $f_l$ are cut off, a width of said waveguide at the other end of said waveguide, including said local oscillator input terminal, being larger than the width of the waveguide on said one end,
    said mixer diode being disposed in a transition region of said waveguide, said transition region forming a junction between the one end of the waveguide including the waveguide signal input terminal and the other end of the waveguide including the local oscillation input terminal.

6. An image suppression mixer of the waveguide type according to claim 5 wherein the lateral width of said local oscillation input waveguide end is dimensioned so as to allow passage of the signal frequencies $f_s$ and the local oscillation frequency $f_l$ and cut off the image frequencies $f_m$.

7. An image suppression mixer of the waveguide type according to claim 5 wherein the lateral width of said local oscillation input waveguide end is selected to be of a dimension so as to cut off the image frequency $f_m$.

8. An image suppression mixer of the waveguide type according to claim 5 further comprising a metal plate inserted at the center of the end of the local oscillation input terminal in the direction of signal propagation.

9. An image suppression mixer of the waveguide type according to claim 5 wherein said transition region is a $\lambda/4$ waveguide transformer where $\lambda$ is a wavelength.

10. The image suppression mixer of the waveguide type according to claim 5 wherein said transition region is a tapered waveguide.

* * * * *